US012805176B2

(12) United States Patent
Forrest et al.

(10) Patent No.: US 12,805,176 B2
(45) Date of Patent: Nov. 17, 2026

(54) ORGANIC VAPOR JET PRINTING SYSTEM

(71) Applicant: THE REGENTS OF THE UNIVERSITY OF MICHIGAN, INNOVATION PARTNERSHIPS, Ann Arbor, MI (US)

(72) Inventors: Stephen R. Forrest, Ann Arbor, MI (US); Jeffrey A. Horowitz, Ann Arbor, MI (US); Boning Qu, Ann Arbor, MI (US)

(73) Assignee: THE REGENTS OS THE UNIVERSITY OF MICHIGAN, INNOVATION PARTNERSHIPS, Ann Arbor, MI (US)

( * ) Notice: Subject to any disclaimer, the term of this patent is extended or adjusted under 35 U.S.C. 154(b) by 294 days.

(21) Appl. No.: 18/769,775

(22) Filed: Jul. 11, 2024

(65) Prior Publication Data

US 2025/0024746 A1 Jan. 16, 2025

Related U.S. Application Data

(60) Provisional application No. 63/526,703, filed on Jul. 14, 2023.

(51) Int. Cl.
*H10K 71/18* (2023.01)
*C23C 16/44* (2006.01)
(Continued)

(52) U.S. Cl.
CPC ......... *H10K 71/18* (2023.02); *C23C 16/4412* (2013.01); *C23C 16/4481* (2013.01);
(Continued)

(58) Field of Classification Search
CPC ........................... H10K 71/18; C23C 16/4412; C23C 16/4481; C23C 16/45519;
(Continued)

(56) References Cited

U.S. PATENT DOCUMENTS

| | | | |
|---|---|---|---|
| 4,769,292 | A | 9/1988 | Tang |
| 5,247,190 | A | 9/1993 | Friend |

(Continued)

FOREIGN PATENT DOCUMENTS

| | | | |
|---|---|---|---|
| WO | 2008057394 | A1 | 5/2008 |
| WO | 2010011390 | A2 | 1/2010 |

OTHER PUBLICATIONS

Baldo et al. "Highly efficient phosphorescent emission from organic electroluminescent devices", Nature, vol. 395, pp. 151-154, 1998.

(Continued)

*Primary Examiner* — Jeffrie R Lund
(74) *Attorney, Agent, or Firm* — Butzel Long

(57) ABSTRACT

Embodiments of the disclosed subject matter provide an organic vapor jet printing (OVJP) system having a printhead that include a fluidic shutter comprising a plurality of microchannels that are in fluidic communication with one another, and a micronozzle array connected to the fluidic shutter. The plurality of microchannels include a first microchannel to receive the carrier-organic mixture, a second microchannel to receive a blocking gas, a third microchannel connected to the micronozzle array, and a fourth microchannel connected to an exhaust line. The carrier-organic mixture may be deposited on a substrate when the apparatus operates in a first operating mode, and the blocking gas may direct evaporated organic material of the carrier-organic mix to the exhaust line when the apparatus operates in a second operating mode.

12 Claims, 16 Drawing Sheets

(51) Int. Cl.
*C23C 16/448* (2006.01)
*C23C 16/455* (2006.01)

(52) U.S. Cl.
CPC .. *C23C 16/45519* (2013.01); *C23C 16/45563* (2013.01); *C23C 16/45591* (2013.01)

(58) Field of Classification Search
CPC ........ C23C 16/45563; C23C 16/45591; C23C 14/04; C23C 14/12; C23C 14/228
See application file for complete search history.

(56) References Cited

U.S. PATENT DOCUMENTS

| | | | | |
|---|---|---|---|---|
| 5,703,436 | A | 12/1997 | Forrest | |
| 5,707,745 | A | 1/1998 | Forrest | |
| 5,834,893 | A | 11/1998 | Bulovic | |
| 5,844,363 | A | 12/1998 | Gu | |
| 6,013,982 | A | 1/2000 | Thompson | |
| 6,087,196 | A | 7/2000 | Sturm | |
| 6,091,195 | A | 7/2000 | Forrest | |
| 6,097,147 | A | 8/2000 | Baldo | |
| 6,294,398 | B1 | 9/2001 | Kim | |
| 6,303,238 | B1 | 10/2001 | Thompson | |
| 6,337,102 | B1 | 1/2002 | Forrest | |
| 6,468,819 | B1 | 10/2002 | Kim | |
| 6,537,688 | B2 | 3/2003 | Silvernail | |
| 6,597,111 | B2 | 7/2003 | Silvernail | |
| 6,664,137 | B2 | 12/2003 | Weaver | |
| 6,835,950 | B2 | 12/2004 | Brown | |
| 6,888,305 | B2 | 5/2005 | Weaver | |
| 6,888,307 | B2 | 5/2005 | Silvernail | |
| 6,897,474 | B2 | 5/2005 | Brown | |
| 7,187,119 | B2 | 3/2007 | Weaver | |
| 7,279,704 | B2 | 10/2007 | Walters | |
| 7,431,968 | B1 | 10/2008 | Shtein | |
| 7,683,534 | B2 | 3/2010 | Weaver | |
| 7,968,146 | B2 | 6/2011 | Wagner | |
| 11,292,245 | B2 | 4/2022 | Bishop | |
| 11,552,247 | B2 | 1/2023 | Forrest | |
| 2003/0230980 | A1 | 12/2003 | Forrest | |
| 2004/0174116 | A1 | 9/2004 | Lu | |
| 2011/0059259 | A1* | 3/2011 | Burrows | C23C 14/228 427/457 |
| 2017/0186949 | A1* | 6/2017 | Jing | C23C 14/04 |
| 2017/0229663 | A1 | 8/2017 | Tsai | |
| 2019/0256968 | A1* | 8/2019 | Quinn | C23C 14/243 |
| 2020/0303645 | A1* | 9/2020 | Forrest | B81B 7/008 |
| 2021/0206162 | A1* | 7/2021 | Bishop | B41J 2/04501 |
| 2021/0343941 | A1* | 11/2021 | Forrest | B05D 1/02 |
| 2025/0024746 | A1* | 1/2025 | Forrest | C23C 16/45563 |
| 2025/0380604 | A1* | 12/2025 | Forrest | H10K 71/164 |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

M. Shtein, P. Peumans, J. B. Benziger, and S. R. Forrest, "Direct mask-free patterning of molecular organic semiconductors using organic vapor jet printing," J. Appl. Phys., vol. 96, pp. 4500-4507, 2004.

McGraw, "Organic vapor jet printing at micrometer resolution using microfluidic nozzle arrays", Applied Physics Letters 98, 013302 (2011).

Gregory J. McGraw. "High Resolution Organic Vapor Jet Printing of Phosphorescent Organic Light Emitting Diode Arrays." PhD Thesis. Department of Physics. University of Michigan. Jun. 12, 2013. Available on line at: https://deepblue.lib.umich.edu/handle/2027.42/97921?show=full. (Year: 2013).

G. J. McGraw and S. R. Forrest, "Fluid dynamics and mass transport in organic vapor jet printing," J. Appl. Phys., vol. 111, No. 043501, 2012.

J. A. Horowitz et al., "Printable Organic Electronics Materials for Precisely Positioned Cell Attachment," Langmuir, vol. 37, No. 5, pp. 1874-1881, 2021.

C. Yun et al., "Digital-Mode Organic Vapor-Jet Printing (D-OVJP): Advanced Jet-on-Demand Control of Organic Thin-Film Deposition," Adv. Mater., vol. 24, No. 11, pp. 2857-2862, 2012.

* cited by examiner

ORGANIC VAPOR JET PRINTING SYSTEM

CROSS-REFERENCE TO RELATED APPLICATIONS

This application claims priority to U.S. Patent Application Ser. No. 63/526,703, filed Jul. 14, 2023, the entire contents of which are incorporated herein by reference.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and Universal Display Corporation. The agreement was in effect on and before the effective filing date of the presently claimed invention, and the claimed invention was made as a result of activities undertaken within the scope of the agreement.

FIELD

The present invention relates to an Organic Vapor Jet Printing (OVJP) system that includes a shutter based on gas flow, and techniques for using the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent molecules capable of phosphorescent emission is a full color display. Industry standards for such a display call for pixels adapted to emit particular colors, referred to as "saturated" colors. In particular, these standards call for saturated red, green, and blue pixels. Alternatively, the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

Layers, materials, regions, and devices may be described herein in reference to the color of light they emit. In general, as used herein, an emissive region that is described as producing a specific color of light may include one or more emissive layers disposed over each other in a stack.

As used herein, a "red" layer, material, region, or device refers to one that emits light in the range of about 580-700 nm or having a highest peak in its emission spectrum in that region. Similarly, a "green" layer, material, region, or device refers to one that emits or has an emission spectrum with a peak wavelength in the range of about 500-600 nm; a "blue" layer, material, or device refers to one that emits or has an emission spectrum with a peak wavelength in the range of about 400-500 nm; a "yellow" layer, material, region, or device refers to one that has an emission spectrum with a peak wavelength in the range of about 540-600 nm; a "cyan" layer, material, or device refers to one that emits or has an emission spectrum with a peak wavelength in the range of about 490-520 nm; and an "orange" layer, material, or device refers to one that emits or has an emission spectrum with a peak wavelength in the range of about 570-620 nm. In some arrangements, separate regions, layers, materials, regions, or devices may provide separate "deep blue" and a "light blue" light. As used herein, in arrangements that provide separate "light blue" and "deep blue", the "deep blue" component refers to one having a peak emission wavelength that is at least about 4 nm less than the peak emission wavelength of the "light blue" component. Typically, a "light blue" component has a peak emission wavelength in the range of about 465-500 nm, and a "deep blue" component has a peak emission wavelength in the range of about 400-470 nm, though these ranges may vary for some configurations. Similarly, a color altering layer refers to a layer that converts or modifies another color of light to light having a wavelength as specified for that color. For example, a "red" color filter refers to a filter that results in light having a wavelength in the range of about 580-700 nm. In general, there are two classes of color altering layers: color filters that modify a spectrum by removing unwanted wavelengths of light, and color changing layers that convert photons of higher energy to lower energy. A component "of a color" refers to a component that, when activated or used, produces or otherwise emits light having a particular color as previously described. For example, a "first emissive region of a first color" and a "second emissive region of a second color different than the first color" describes two emissive regions that, when activated within a device, emit two different colors as previously described.

As used herein, emissive materials, layers, and regions may be distinguished from one another and from other structures based upon the spectrum of light initially generated by the material, layer or region, as opposed to light eventually emitted by the same or a different structure. The initial light generation typically is the result of an energy level change resulting in emission of a photon. For example, an organic emissive material may initially generate blue light, which may be converted by a color filter, quantum dot or other structure to red or green light, such that a complete emissive stack or sub-pixel emits the red or green light. In this case the initial emissive material or layer may be referred to as a "blue" component, even though the sub-pixel is a "red" or "green" component.

In some cases, it may be preferable to describe the color of a component such as an emissive region, sub-pixel, color altering layer, or the like, in terms of 1931 CIE coordinates. For example, a yellow emissive material may have multiple peak emission wavelengths, one in or near an edge of the "green" region, and one within or near an edge of the "red" region as previously described. Accordingly, as used herein, each color term also corresponds to a shape in the 1931 CIE coordinate color space. The shape in 1931 CIE color space is constructed by following the locus between two color points and any additional interior points. For example, interior shape parameters for red, green, blue, and yellow may be defined as shown below:

| Color | CIE Shape Parameters |
|---|---|
| Central Red | Locus: [0.6270, 0.3725]; [0.7347, 0.2653]; Interior: [0.5086, 0.2657] |
| Central Green | Locus: [0.0326, 0.3530]; [0.3731, 0.6245]; Interior: [0.2268, 0.3321 |
| Central Blue | Locus: [0.1746, 0.0052]; [0.0326, 0.3530]; Interior: [0.2268, 0.3321] |
| Central Yellow | Locus: [0.373 l, 0.6245]; [0.6270, 0.3725]; Interior: [0.3 700, 0.4087]; [0.2886, 0.4572] |

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

According to an embodiment, an organic vapor jet printing (OVJP) system may include an organic material source, a carrier gas source, a blocking gas supply, and a printhead in fluidic communication with the organic material source and the carrier gas source. The printhead may include a fluidic shutter comprising a plurality of microchannels that are in fluidic communication with one another, and a micronozzle array connected to the fluidic shutter. The plurality of microchannels may include a first microchannel to receive a carrier-organic mixture, a second microchannel to receive a blocking gas from the blocking gas supply, a third microchannel fluidically connected to the micronozzle array, and a fourth microchannel fluidically connected to an exhaust line. The carrier-organic mixture may be provided to the micronozzle array for deposition on a substrate when the apparatus is configured to operate in a first operating mode. The blocking gas may direct evaporated organic material of the carrier-organic mix to the exhaust line when the apparatus is configured to operate in a second operating mode.

The plurality of microchannels may be arranged in a predetermined geometry, where an angle between the first microchannel, the second microchannel, the third microchannel, and the fourth microchannel varies based on the predetermined geometry. The predetermined geometry may be an x-shaped geometry, and/or a cross-shaped geometry.

The fluidic shutter may be controlled by a speed of the carrier organic and the blocking gas, diffusivity of the carrier-organic, and/or a size of the plurality of microchannels.

The blocking gas may include xenon gas, krypton gas, nitrogen gas, and/or argon gas.

The blocking gas may decrease a diffusivity of the carrier-organic mixture into a blocking stream.

The apparatus may include a solenoid valve to keep the blocking gas at a predetermined high pressure. When the solenoid valve is opened, the blocking gas may flow through at least one of the plurality of microchannels.

One or more gas inlets of the apparatus coupled to the micronozzle array may be tapered to increase the velocity of the carrier-organic mix.

A size of at least one the plurality of microchannels of the apparatus may be decreased to increase a speed of the fluidic shutter.

According to an embodiment, a printhead may include a fluidic shutter comprising a plurality of microchannels that are in fluidic communication with one another, and a micronozzle array connected to the fluidic shutter. The plurality of microchannels may include a first microchannel to receive a carrier-organic mixture, a second microchannel to receive a blocking gas from a blocking gas supply, a third microchannel fluidically connected to the micronozzle array, and a fourth microchannel fluidically connected to an exhaust line. The carrier-organic mixture may be provided to the micronozzle array for deposition on a substrate when the print head is configured to operate in a first operating mode. The blocking gas may direct evaporated organic material of the carrier-organic mix to the exhaust line when the print head is configured to operate in a second operating mode.

According to an embodiment, a fluidic shutter may include a plurality of microchannels that are in fluidic communication with one another. The plurality of microchannels may include a first microchannel to receive a carrier-organic mixture, a second microchannel to receive a blocking gas from a blocking gas supply, a third microchannel fluidically connected to the micronozzle array, and a fourth microchannel fluidically connected to an exhaust line. The carrier-organic mixture may be provided to the micronozzle array for deposition on a substrate when the fluidic shutter is configured to operate in a first operating mode. The blocking gas may direct evaporated organic material of the carrier-organic mix to the exhaust line when the fluidic shutter is configured to operate in a second operating mode.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
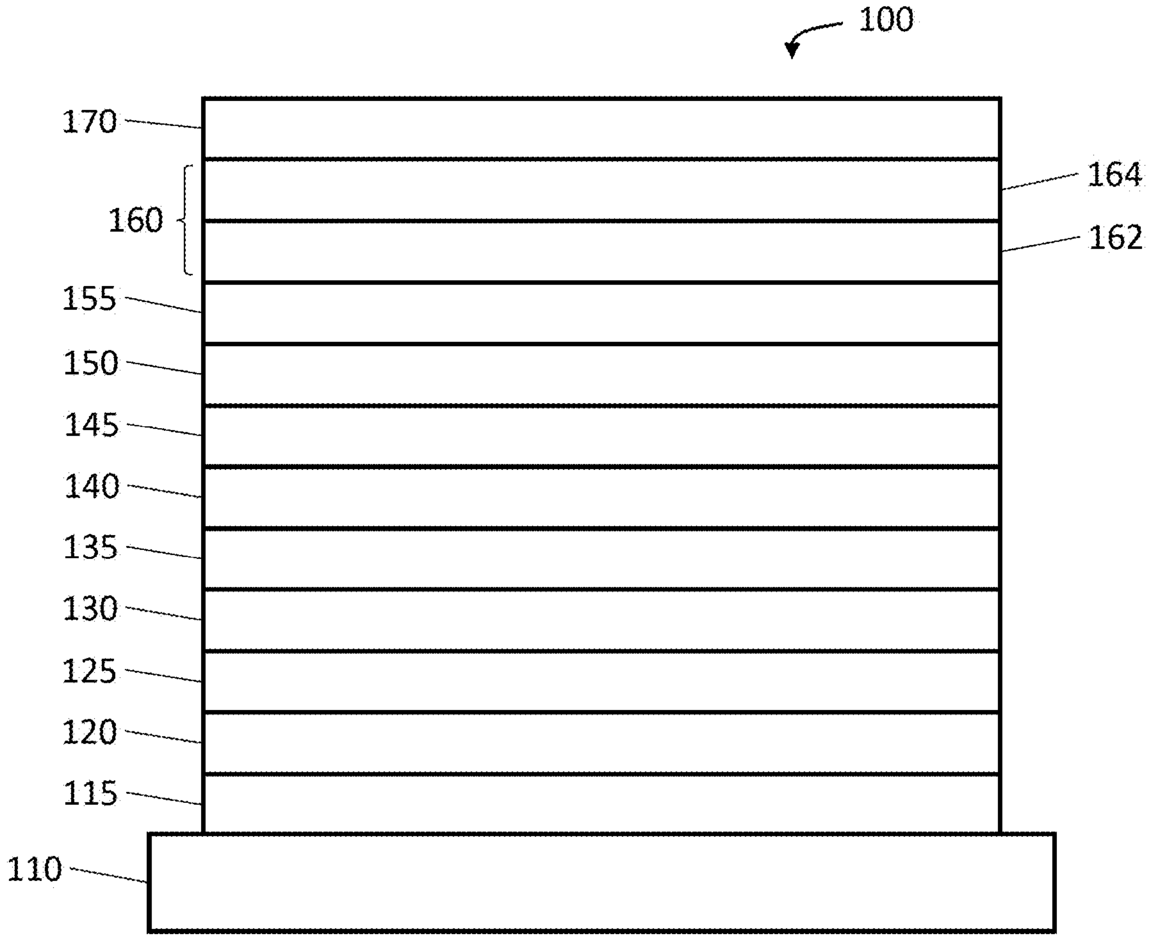
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. Barrier layer 170 may be a single- or multi-layer barrier and may cover or surround the other layers of the device. The barrier layer 170 may also surround the substrate 110, and/or it may be arranged between the substrate and the other layers of the device. The barrier also may be referred to as an encapsulant, encapsulation layer, protective layer, or permeation barrier, and typically provides protection against permeation by moisture, ambient air, and other similar materials through to the other layers of the device. Examples of barrier layer materials and structures are provided in U.S. Pat. Nos. 6,537,688, 6,597,111, 6,664,137, 6,835,950, 6,888,305, 6,888,307, 6,897,474, 7,187,119, and 7,683,534, each of which is incorporated by reference in its entirety.

Figure 2:
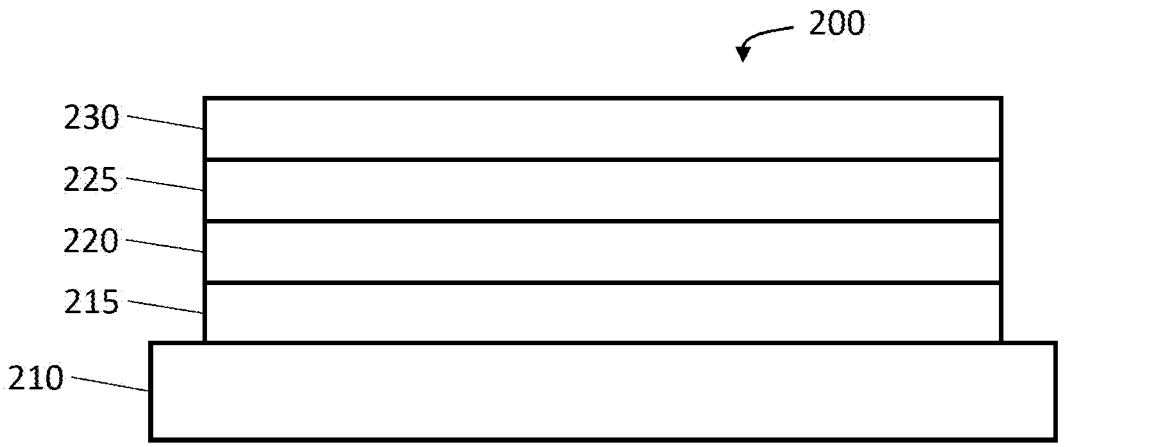
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In some embodiments disclosed herein, emissive layers or materials, such as emissive layer 135 and emissive layer 220 shown in FIGS. 1-2, respectively, may include quantum dots. An "emissive layer" or "emissive material" as disclosed herein may include an organic emissive material and/or an emissive material that contains quantum dots or equivalent structures, unless indicated to the contrary explicitly or by context according to the understanding of one of skill in the art. In general, an emissive layer includes emissive material within a host matrix. Such an emissive layer may include only a quantum dot material which converts light emitted by a separate emissive material or other emitter, or it may also include the separate emissive material or other emitter, or it may emit light itself directly from the application of an electric current. Similarly, a color altering layer, color filter, upconversion, or downconversion layer or structure may include a material containing quantum dots, though such layer may not be considered an "emissive layer" as disclosed herein. In general, an "emissive layer" or material is one that emits an initial light based on an injected electrical charge, where the initial light may be altered by another layer such as a color filter or other color altering layer that does not itself emit an initial light within the device, but may re-emit altered light of a different spectra content based upon absorption of the initial light emitted by the emissive layer and downconversion to a lower energy light emission. In some embodiments disclosed herein, the color altering layer, color filter, upconversion, and/or downconversion layer may be disposed outside of an OLED device, such as above or below an electrode of the OLED device.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution-based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

In some embodiments, at least one of the anode, the cathode, or a new layer disposed over the organic emissive layer functions as an enhancement layer. The enhancement layer comprises a plasmonic material exhibiting surface plasmon resonance that non-radiatively couples to the emitter material and transfers excited state energy from the emitter material to non-radiative mode of surface plasmon polariton. The enhancement layer is provided no more than a threshold distance away from the organic emissive layer, wherein the emitter material has a total non-radiative decay rate constant and a total radiative decay rate constant due to the presence of the enhancement layer and the threshold distance is where the total non-radiative decay rate constant is equal to the total radiative decay rate constant. In some embodiments, the OLED further comprises an outcoupling layer. In some embodiments, the outcoupling layer is disposed over the enhancement layer on the opposite side of the organic emissive layer. In some embodiments, the outcoupling layer is disposed on opposite side of the emissive layer from the enhancement layer but still outcouples energy from the surface plasmon mode of the enhancement layer. The outcoupling layer scatters the energy from the surface plasmon polaritons. In some embodiments this energy is scattered as photons to free space. In other embodiments, the energy is scattered from the surface plasmon mode into other modes of the device such as but not limited to the organic waveguide mode, the substrate mode, or another waveguiding mode. If energy is scattered to the non-free space mode of the OLED other outcoupling schemes could be incorporated to extract that energy to free space. In some embodiments, one or more intervening layer can be disposed between the enhancement layer and the outcoupling layer. The examples for intervening layer(s) can be dielectric materials, including organic, inorganic, perovskites, oxides, and may include stacks and/or mixtures of these materials.

The enhancement layer modifies the effective properties of the medium in which the emitter material resides resulting in any or all of the following: a decreased rate of emission, a modification of emission line-shape, a change in emission intensity with angle, a change in the stability of the emitter material, a change in the efficiency of the OLED, and reduced efficiency roll-off of the OLED device. Placement of the enhancement layer on the cathode side, anode side, or on both sides results in OLED devices which take advantage of any of the above-mentioned effects. In addition to the specific functional layers mentioned herein and illustrated in the various OLED examples shown in the figures, the OLEDs according to the present disclosure may include any of the other functional layers often found in OLEDs.

The enhancement layer can be comprised of plasmonic materials, optically active metamaterials, or hyperbolic metamaterials. As used herein, a plasmonic material is a material in which the real part of the dielectric constant crosses zero in the visible or ultraviolet region of the electromagnetic spectrum. In some embodiments, the plasmonic material includes at least one metal. In such embodiments the metal may include at least one of Ag, Al, Au, Ir, Pt, Ni, Cu, W, Ta, Fe, Cr, Mg, Ga, Rh, Ti, Ru, Pd, In, Bi, Ca alloys or mixtures of these materials, and stacks of these materials. In general, a metamaterial is a medium composed of different materials where the medium as a whole acts differently than the sum of its material parts. In particular, we define optically active metamaterials as materials which have both negative permittivity and negative permeability. Hyperbolic metamaterials, on the other hand, are anisotropic media in which the permittivity or permeability are of different sign for different spatial directions. Optically active metamaterials and hyperbolic metamaterials are strictly distinguished from many other photonic structures such as Distributed Bragg Reflectors ("DBRs") in that the medium should appear uniform in the direction of propagation on the length scale of the wavelength of light. Using terminology that one skilled in the art can understand: the dielectric constant of the metamaterials in the direction of propagation can be described with the effective medium approximation. Plasmonic materials and metamaterials provide methods for controlling the propagation of light that can enhance OLED performance in a number of ways.

In some embodiments, the enhancement layer is provided as a planar layer. In other embodiments, the enhancement layer has wavelength-sized features that are arranged periodically, quasi-periodically, or randomly, or sub-wavelength-sized features that are arranged periodically, quasi-periodically, or randomly. In some embodiments, the wavelength-sized features and the sub-wavelength-sized features have sharp edges.

In some embodiments, the outcoupling layer has wavelength-sized features that are arranged periodically, quasi-periodically, or randomly, or sub-wavelength-sized features that are arranged periodically, quasi-periodically, or randomly. In some embodiments, the outcoupling layer may be composed of a plurality of nanoparticles and in other embodiments the outcoupling layer is composed of a plurality of nanoparticles disposed over a material. In these embodiments the outcoupling may be tunable by at least one of varying a size of the plurality of nanoparticles, varying a shape of the plurality of nanoparticles, changing a material of the plurality of nanoparticles, adjusting a thickness of the material, changing the refractive index of the material or an additional layer disposed on the plurality of nanoparticles, varying a thickness of the enhancement layer, and/or varying the material of the enhancement layer. The plurality of nanoparticles of the device may be formed from at least one of metal, dielectric material, semiconductor materials, an alloy of metal, a mixture of dielectric materials, a stack or layering of one or more materials, and/or a core of one type of material and that is coated with a shell of a different type of material. In some embodiments, the outcoupling layer is composed of at least metal nanoparticles wherein the metal is selected from the group consisting of Ag, Al, Au, Ir, Pt, Ni, Cu, W, Ta, Fe, Cr, Mg, Ga, Rh, Ti, Ru, Pd, In, Bi, Ca, alloys or mixtures of these materials, and stacks of these materials. The plurality of nanoparticles may have additional layer disposed over them. In some embodiments, the polarization of the emission can be tuned using the outcoupling layer. Varying the dimensionality and periodicity of the outcoupling layer can select a type of polarization that is preferentially outcoupled to air. In some embodiments the outcoupling layer also acts as an electrode of the device.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the thermal population between the triplet states and the singlet excited states. Compounds that are capable of generating E-type delayed fluorescence are required to have very small singlet-triplet gaps. Thermal energy can activate the transition from the triplet state back to the singlet state. This type of delayed fluorescence is also known as thermally activated delayed fluorescence (TADF). A distinctive feature of TADF is that the delayed component increases as temperature rises due to the increased thermal energy. If the reverse intersystem crossing rate is fast enough to minimize the non-radiative decay from the triplet state, the fraction of back populated singlet excited states can potentially reach 75%. The total singlet fraction can be 100%, far exceeding the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap ($\Delta$ES-T). Organic, non-metal containing, donor-acceptor luminescent materials may be able to achieve this. The emission in these materials is often characterized as a donor-acceptor charge-transfer (CT) type emission. The spatial separation of the HOMO and LUMO in these donor-acceptor type compounds often results in small $\Delta$ES-T. These states may involve CT states. Often, donor-acceptor luminescent materials are constructed by connecting an electron donor moiety such as amino- or carbazole-derivatives and an electron acceptor moiety such as N-containing six-membered aromatic ring.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least a 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

Organic vapor jet printing (OVJP) is a method to pattern organic electronic materials without the use of masks. Organic material is evaporated in a vacuum and carried by an inert gas through a micronozzle array. The micronozzle array focuses the inert/organic mixture through a small outlet, allowing direct patterning at both a high rate and a high resolution. Deposition rates of 80 nm/s and widths as small 10 μm have been demonstrated with OVJP. Analytical calculations are complex, so film thickness is usually controlled by changing the translation speed of the substrate rather than by adjusting the temperature of the source cell or the flow rate of the carrier gas. To maximize the deposition rate, the carrier flow is fixed at a value between 0.1 and 1 SCCM (standard cubic centimeters per minute), and the substrate is translated at several mm/s. Deposition continues after the carrier gas is shut off, as there is still carrier gas in the system and a pressure differential between the source cell and the main part of the chamber. OVJP is therefore a continuous deposition process, where an isolated dot cannot be patterned. Embodiments of the disclosed subject matter implement a shutter for OVJP.

Several designs for an OVJP shutter have already been proposed. One strategy is to use an electromechanically controlled MEMS (micro-electromechanical system) shutter to cover the outlets of the nozzles. A polysilicon piece is moved over the outlet and pulled closed by applying a voltage between the polysilicon and the silicon nozzle. This process can occur very quickly and block the entire gas flow. However, the OVJP nozzles must be <20 μm from the substrate to pattern accurately, so a MEMS shutter on the outside of a nozzle must be <10 μm thick to ensure a high-quality deposition. Additionally, a thin electromechanical shutter must be able to withstand the high pressure at the nozzle outlet.

Another shutter design uses pneumatics. Here, a high-strength (e.g., metal) piece is placed in the print head above the nozzle inlets. The piece is moved back and forth over an aperture to allow or disallow a flow to the nozzle array. A pneumatic shutter would likely be slower than an electro-mechanical one but would also be simpler to implement and would not interfere with the distance between the nozzle and the substrate. Finally, OVJP can be "shuttered" by turning off the carrier gas upstream, but as discussed previously, there is significant deposition even without the carrier gas.

Embodiments of the disclosed subject matter provide an OVJP shutter based on gas flow. Some microfluidic systems decrease diffusion between fluids by increasing the flow rate. Embodiments of the disclosed subject matter increase the flow rate by decrease diffusion between fluids with OVJP. With one line leading to the nozzle array, and another exhaust line leading to the chamber away from the substrate, a heavy gas may be used to block deposition. In some embodiments, there may be two streams and/or two modes of operation. During deposition, there may be no flow for the blocking gas, and the OVJP may be performed with a mixture of the carrier gas and organic material to form a carrier-organic mixture. During shuttering, a blocking gas may impinge on the carrier-organic mixture. By redirecting evaporated organic molecules into a microchannel exhaust line, OVJP may be shuttered with no internal mechanical parts.

Figure 3A:
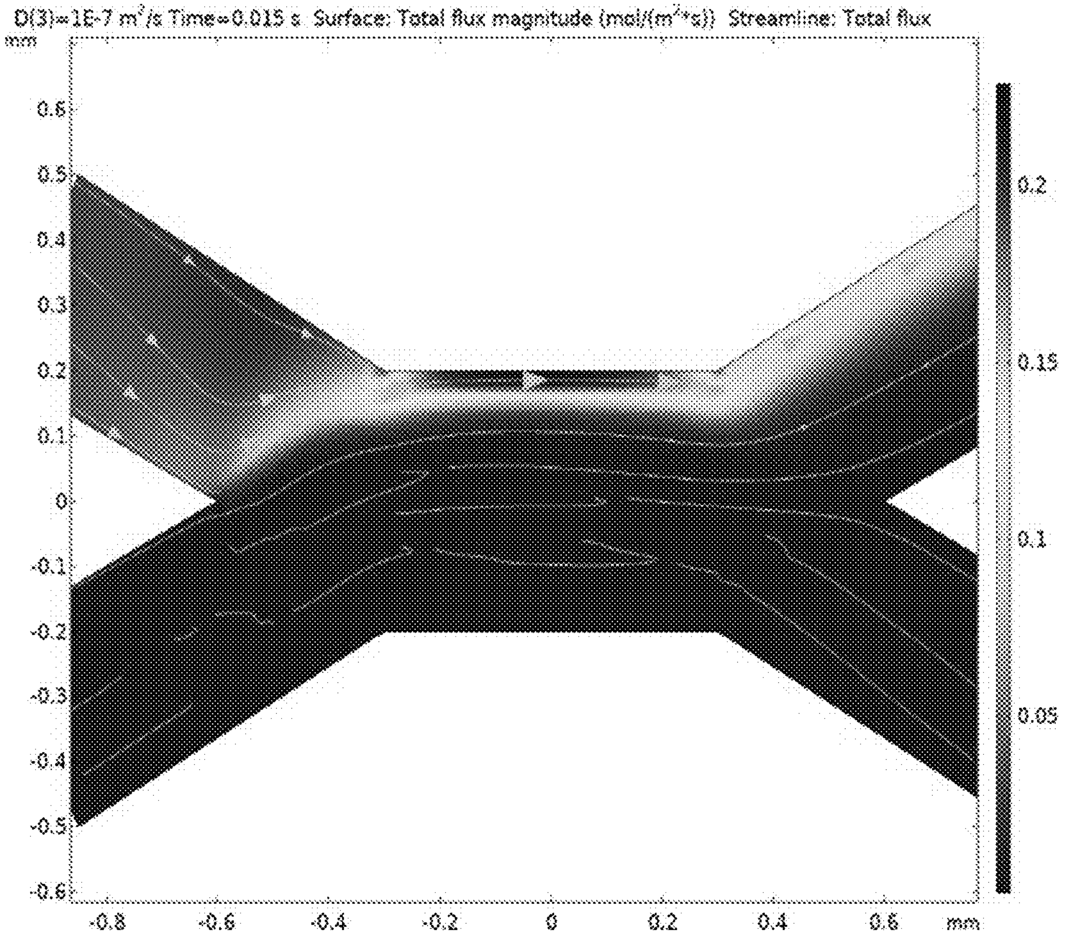
FIG. 3A-3C show paths of organic flux in an X-shaped geometry for different diffusivities according to embodiments of the disclosed subject matter.
Figure 3B:
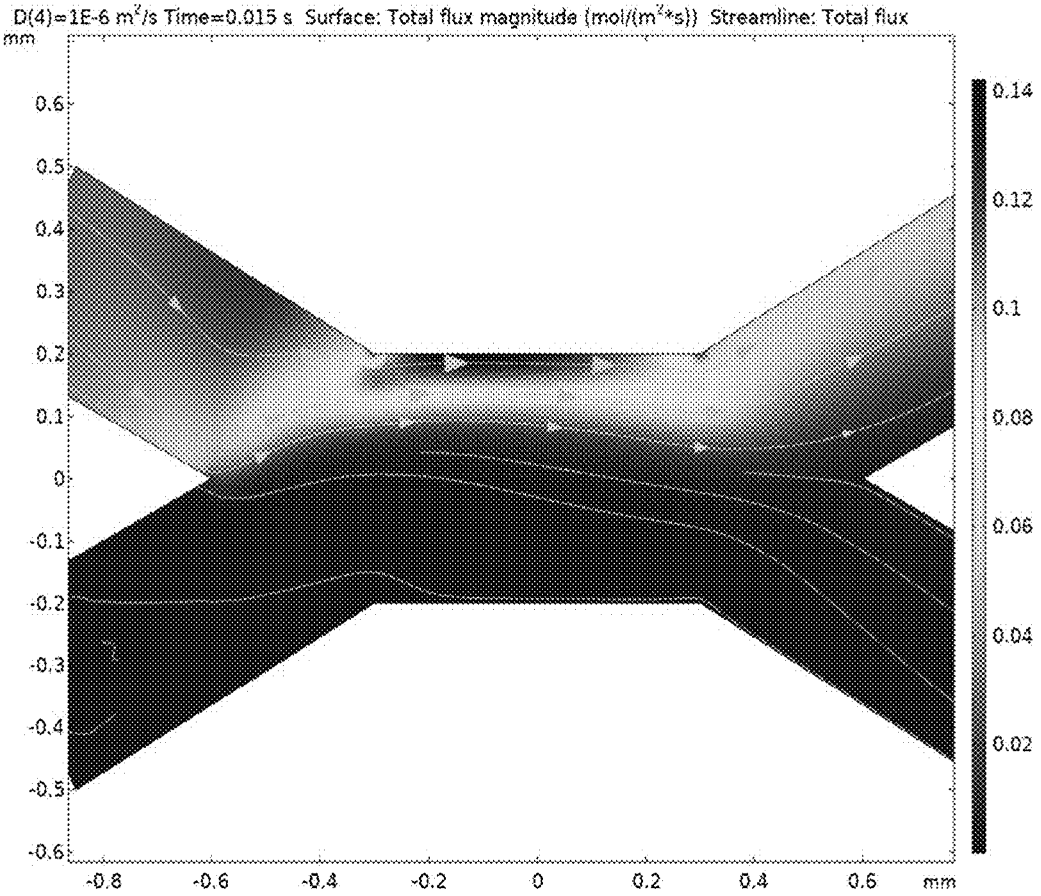
Figure 3C:
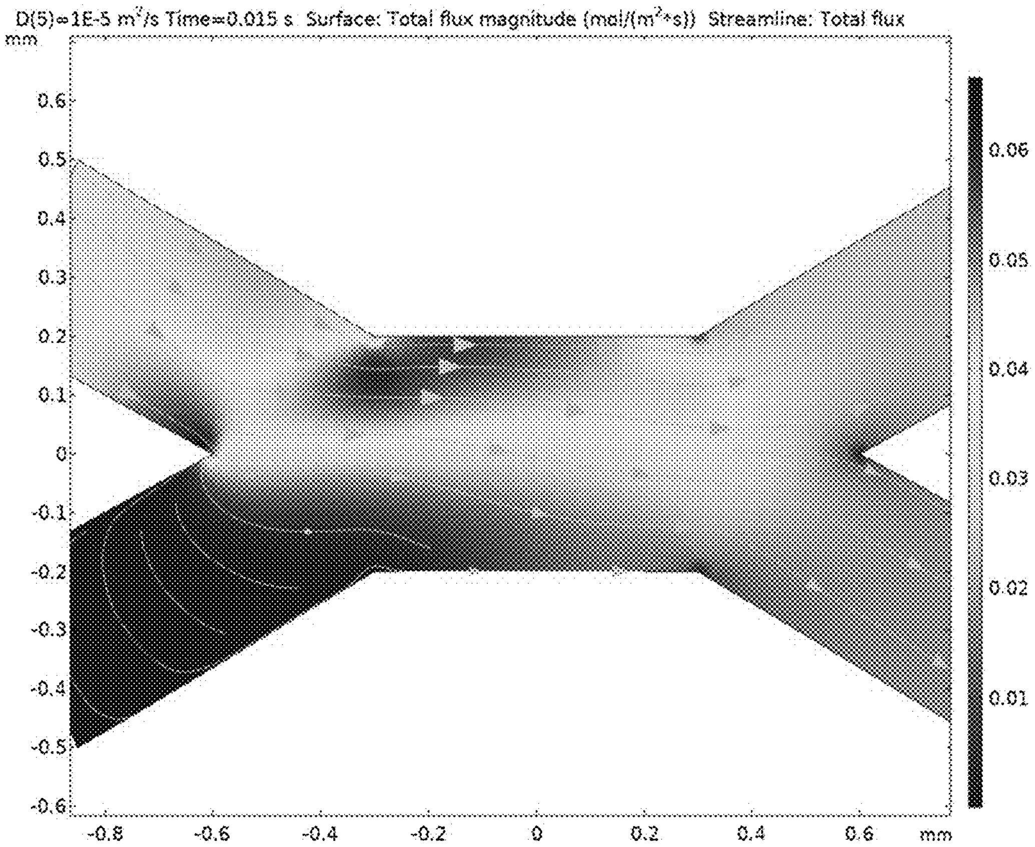

One embodiment of fluidic shuttering may include an X-shaped geometry as shown in FIGS. 3A-3C. The top right channel may connect and/or be in fluidic communication with an organic material source and the bottom right channel may be in fluidic communication with the micronozzle array. The bottom left channel may be the inlet for the blocking gas, and the top right channel may be the exhaust line. Deposition continues for about 10 ms, as there may be organic vapor in the channels, before being cut off by the blocking gas. Organic vapor may be redirected into the exhaust line. Shuttering may occur on the order of 10 to 20 ms, which may be quicker than shutting off the flow upstream.

Figure 4A:
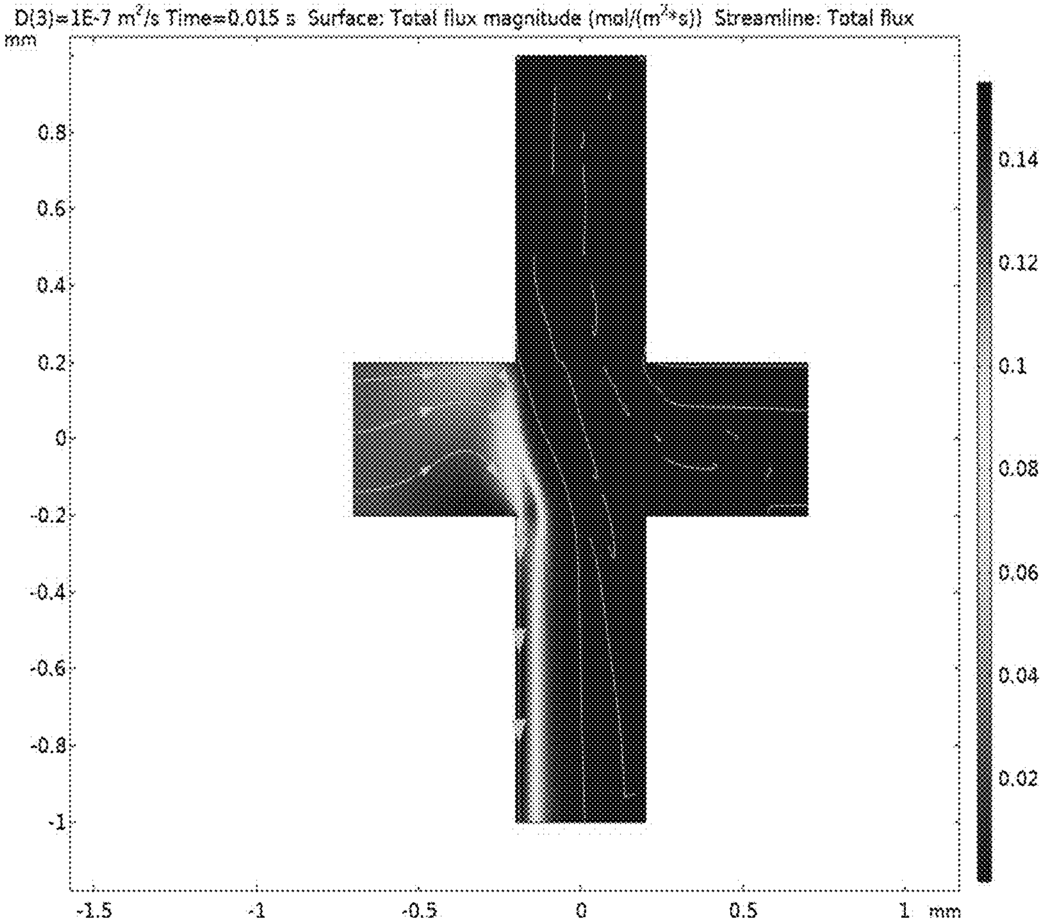
FIG. 4A-4C show path of organic flux in a cross-shaped geometry for different diffusivities according to embodiments of the disclosed subject matter.
Figure 4B:
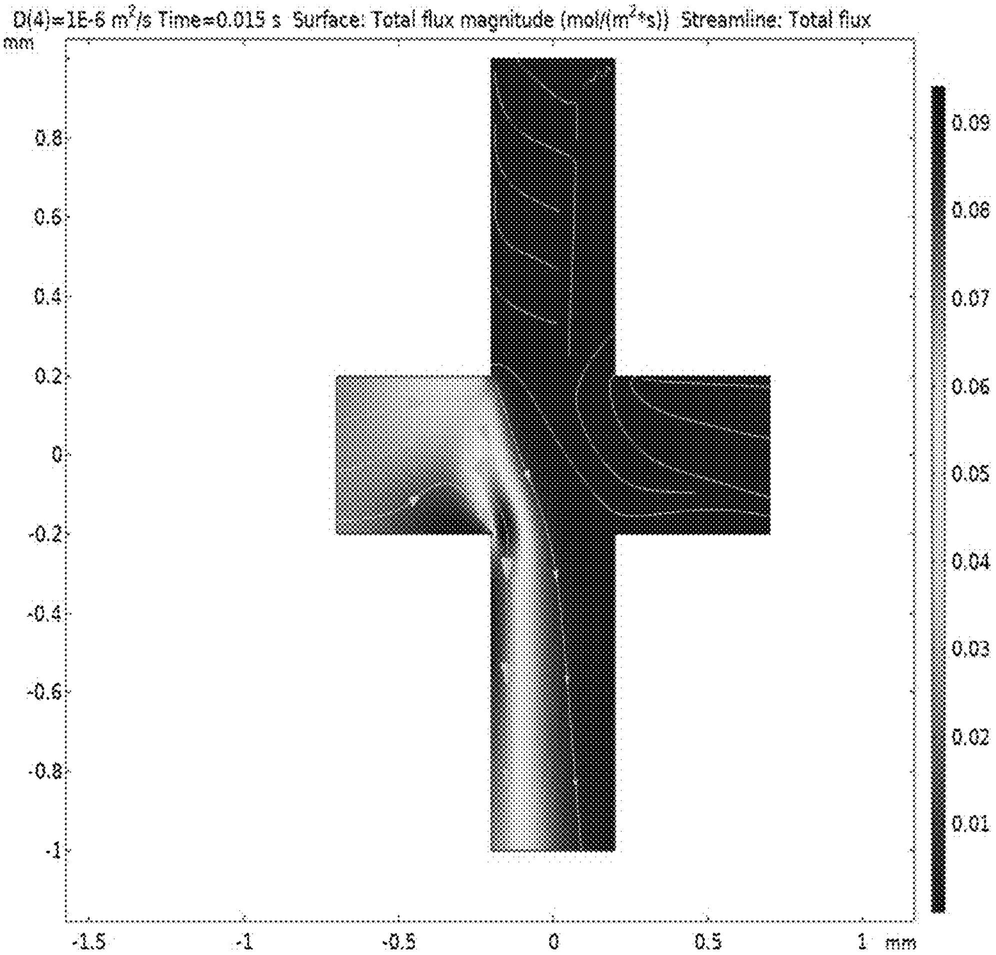
Figure 4C:
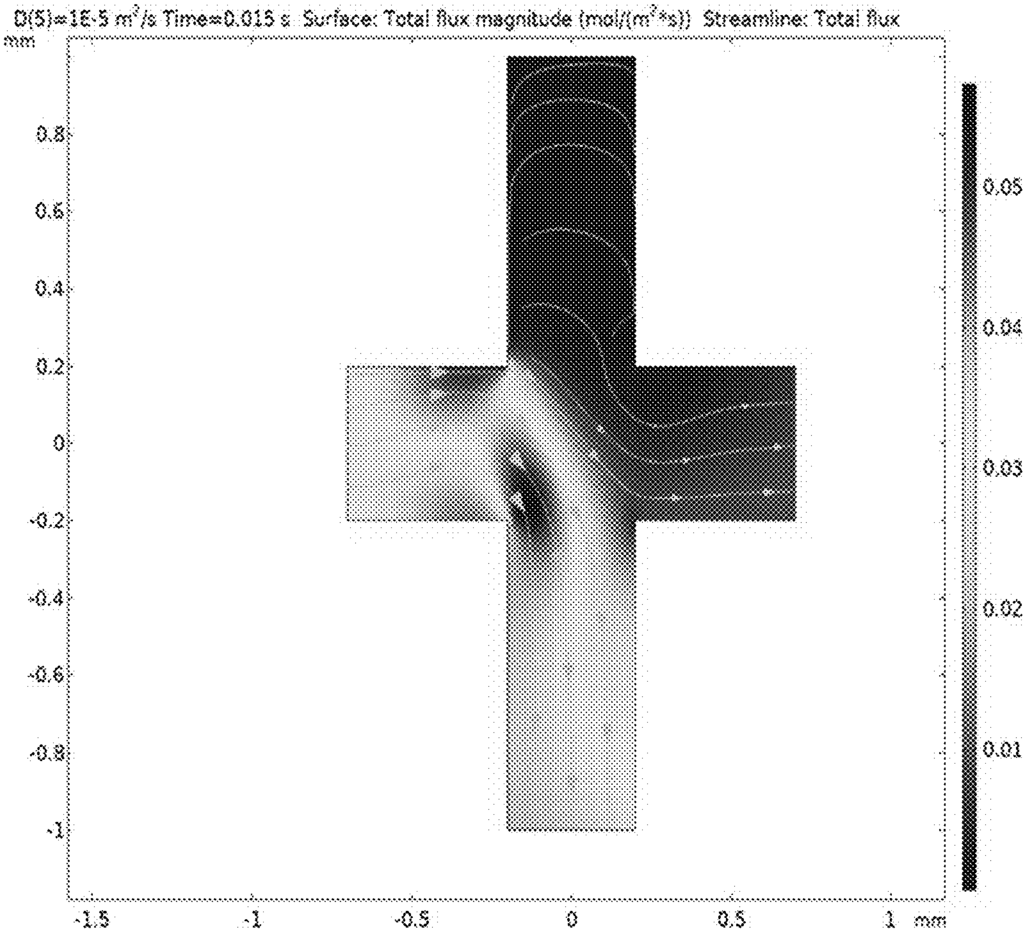

Another embodiment of fluidic shuttering may include a cross-shaped geometry as shown in FIGS. 4A-4C. In this arrangement the blocking stream may impinge on the carrier-organic mixture perpendicularly, which may redirect the carrier-organic mixture to an exhaust line. The left inlet may include the carrier-organic mixture, and the right outlet may be in fluidic communication with the micronozzle array. The top inlet may be for blocking gas, and the bottom outlet may be an exhaust into the chamber away from the substrate.

Factors that may control the effectiveness of a fluidic shutter include the speed of the fluids (e.g., the speed of the speed of the carrier organic and the blocking gas), the diffusivity of the carrier-organic, and/or the size of the microchannels. A heavier blocking gas, such as xenon, krypton, nitrogen, and/or argon may be used to decrease the diffusivity of the organic into the blocking stream. Tapers may be used at the gas inlets to increase the velocity of the gases. The size of the microchannels may be selected to increase the shuttering speed.

Figure 7A:
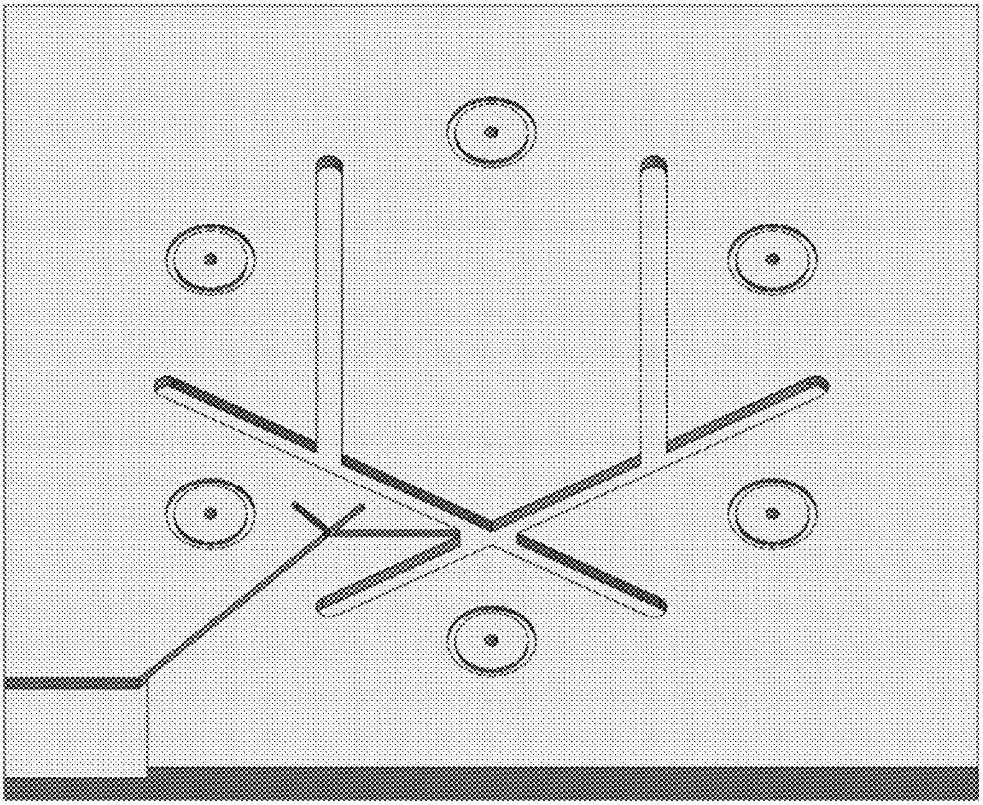
FIGS. 7A-7C show an arrangement of microchannels according to embodiments of the disclosed subject matter.

OVJP may typically include the following operations: (a) organic material is heated and evaporated, (b) evaporated material diffuses into a stream of an inert carrier gas, (c) the carrier-organic mixture is accelerated and focused through a tapered micronozzle array, and (d) organics stick to a cooled substrate while the carrier gas expands in a vacuum. In embodiments of the disclosed subject matter, the shutter may include an additional gas line and an additional microchannel upstream of the nozzle array, connected between (b) and (c), as shown in FIGS. 7A-8B and discussed below. This additional channel may connect to the microchannel system via a high-speed solenoid valve and may run out into the chamber, away from the substrate. In past systems, a Kovar® print head was used as an interface between the source cells and the silicon micronozzle array. Kovar® is typically used because of its low thermal expansion coefficient, on the order of silicon. Therefore, the nozzles will not break when the apparatus is heated. The microchannels may be machined into the Kovar® print head. The arrangement of the microchannels for embodiments of the disclosed subject matter are shown in FIGS. 7A-7C.

Figure 7B:
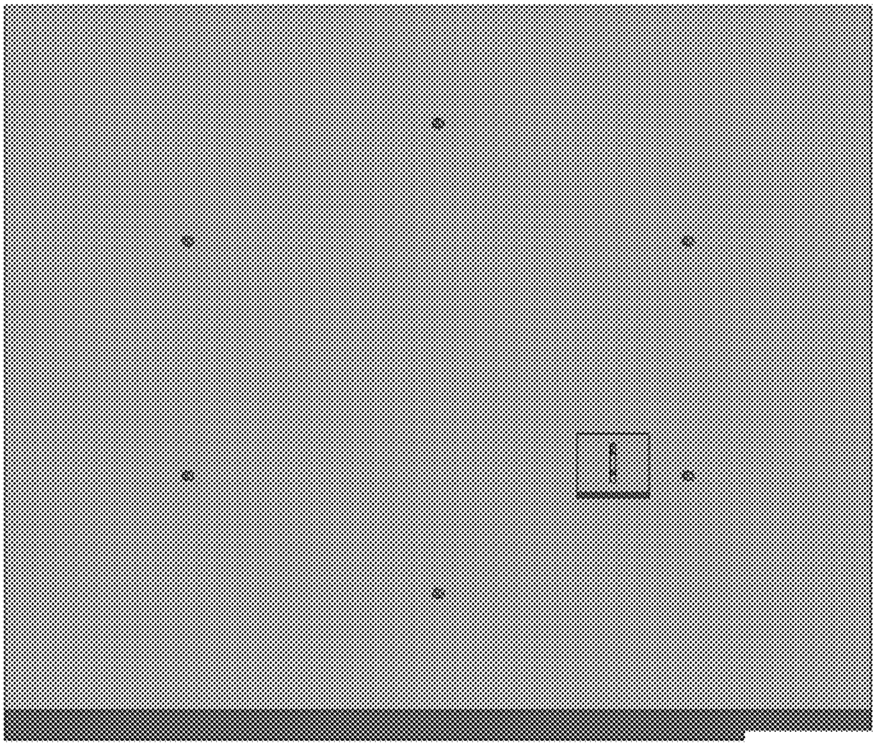
Figure 7C:
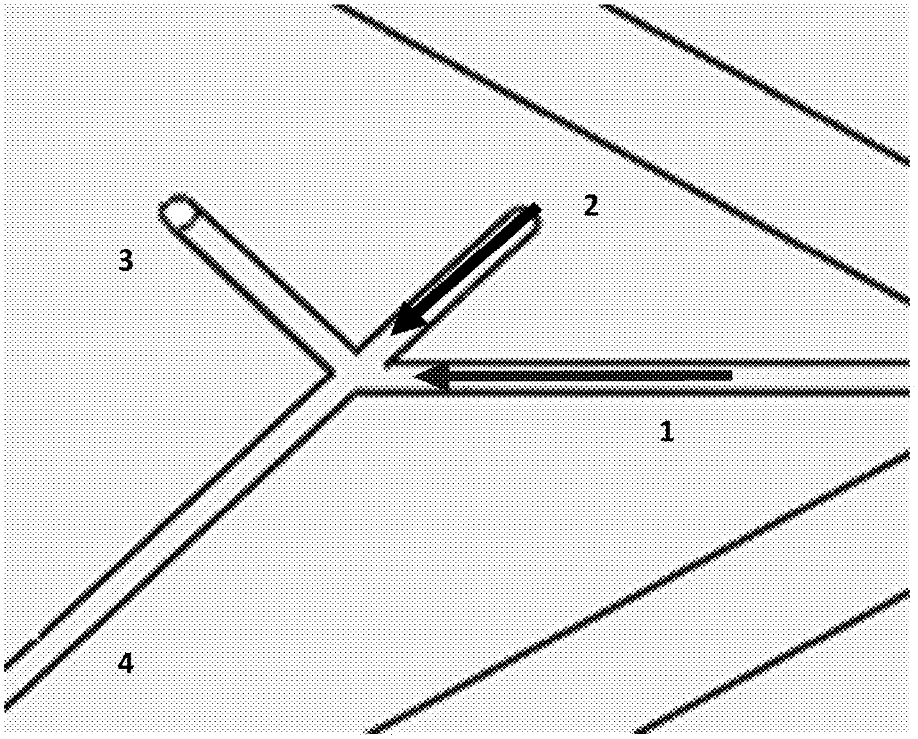
Figure 8A:
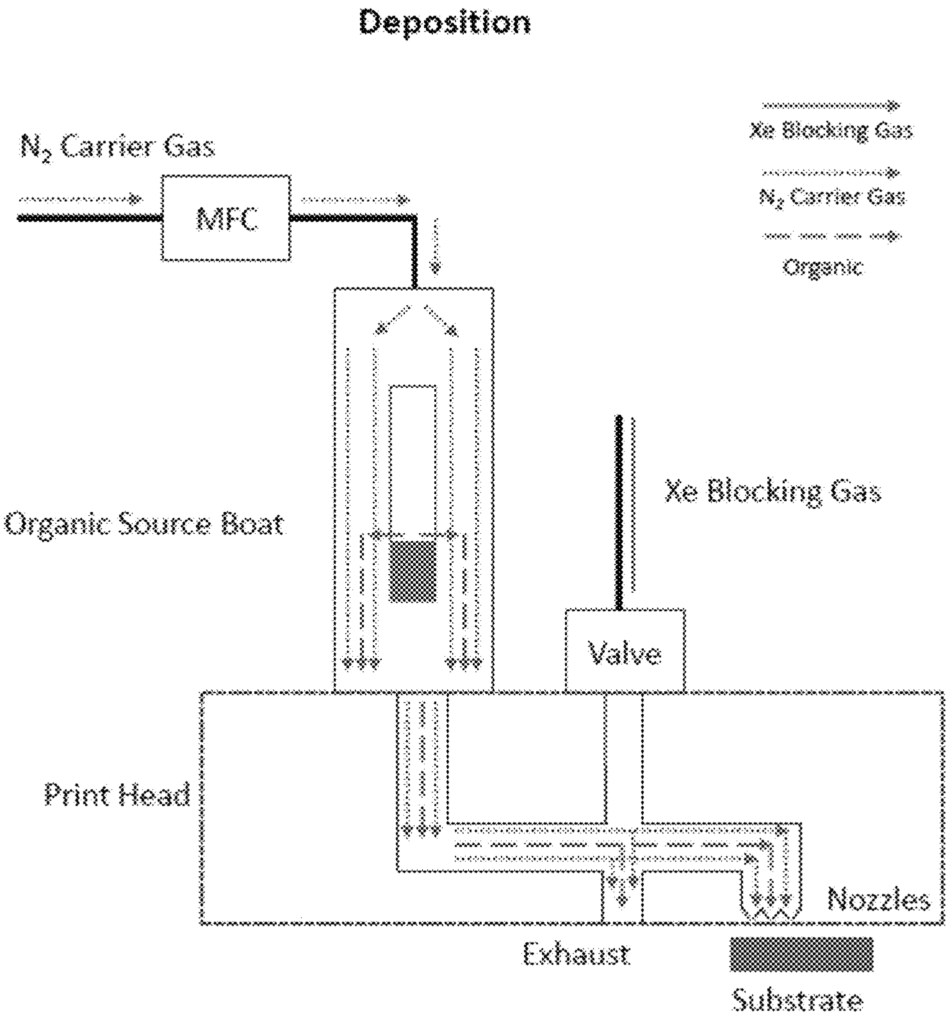
FIG. 8A shows an example OVJP system during deposition.
Figure 8B:
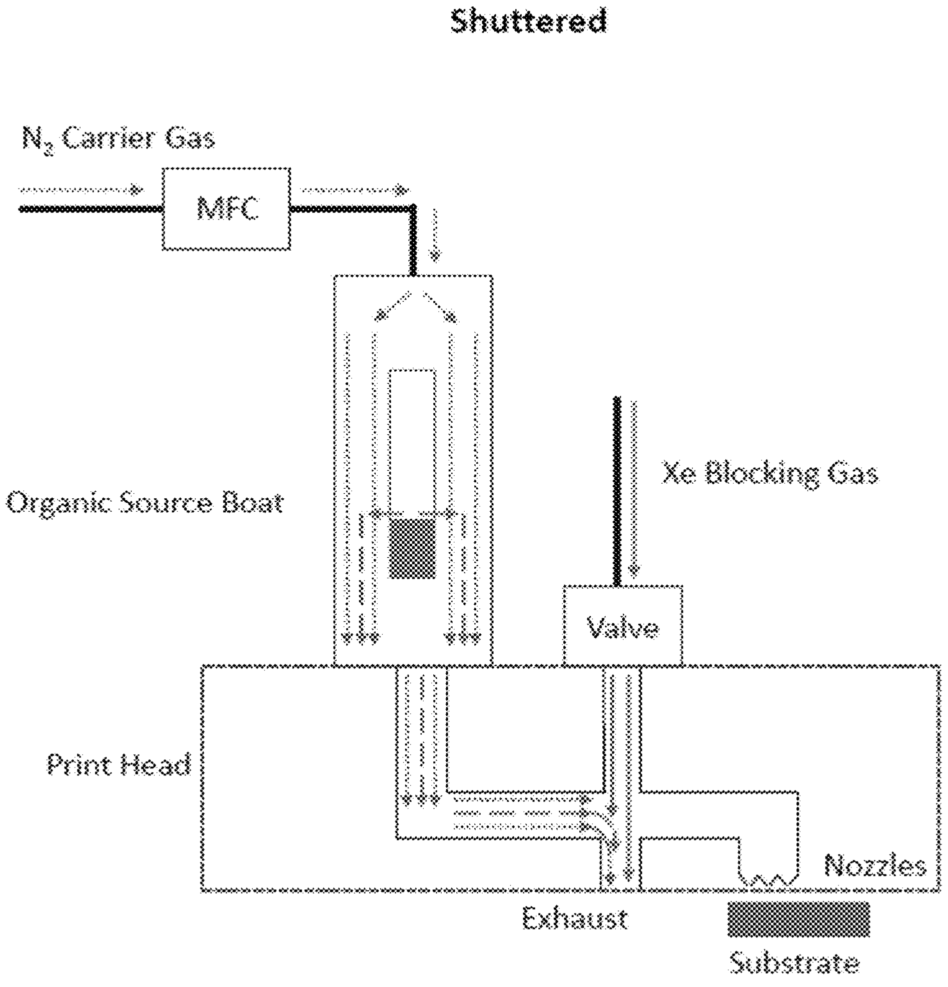
FIG. 8B shows the example OVJP system when shuttering according to embodiments of the disclosed subject matter.

FIG. 7A shows a top side of the printhead, where the gas enters, and FIG. 7B shows the bottom side. A silicon micronozzle array is attached to the raised boss on the bottom side. Considering the holes in the top side shown in FIG. 7A of the print head as the face of a clock, 12, 2, 4, 6, 8, and 10 are where screws may be used to fasten the print head to the rest of the OVJP apparatus (e.g., as shown in FIGS. 8A-8B). Locations 1, 3, 5, 7, 9, and 11 on the clock face may be inlets for the carrier-organic mixture. The six channels may be connected to allow mixing before the mixture travels to the silicon micronozzle array. In FIG. 7C, microchannel 1 connects to the carrier-organic mixture, microchannel 2 may be the entrance point for the blocking gas, microchannel 3 may lead to the micronozzle array, and microchannel 4 may lead to the exhaust. Blocking gas may be connected to microchannel 2 through a needle valve or diaphragm valve, attached perpendicularly to the channel.

The carrier and blocking gases may be nonreactive to avoid interactions with the vapor-phase organic materials. Nitrogen may be typical used for the carrier gas, but blocking may work best with a high molecular weight gas. For example, xenon gas may be used as a blocking gas, as it has a high density and is nonreactive. In another example, krypton gas may be used as a blocking gas, as it is a lighter noble gas, but still much heavier than the nitrogen carrier gas. In another example, nitrogen may be used as the blocking gas if the flow rate is high enough. FIG. 5 shows simulations for the blocking gases. In another example, argon may be used as a blocking gas. Whichever gas is used, the blocking gas may be kept at a high pressure behind a solenoid valve. Once the solenoid valve is opened, the blocking gas may flow through the microchannels, blocking the carrier-organic mixture, and redirecting the mixture into an exhaust line.

FIG. 8A shows an example OVJP system during deposition, and FIG. 8B shows the example OVJP system when shuttering according to embodiments of the disclosed subject matter. The example OVJP systems show a carrier gas (e.g., $N_2$ carrier gas) that may be received by a mass flow controller (MFC), which provides the carrier gas to an organic source boat to form the carrier-organic mixture. A print head including microchannels may direct the carrier-organic mixture to the micronozzle array for deposition on a substrate, and/or to an exhaust. A valve may control the release of blocking gas (e.g., xenon blocking gas). FIG. 8B shows that the valve may be controlled to allow the blocking gas into the printhead, and may direct the carrier-organic mixture to the exhaust.

Fluidic shuttering was simulated with two different geometries and several different flow rates and diffusivities. The carrier-organic mixture was assumed to be flowing at $1\times10^{-8}$ $m^3/s$ or about 0.6 SCCM, which may be a typical value for OVJP. FIGS. 3A-3C show organic flux in the X-shaped geometry, assuming three different diffusivities for the organic semiconductor. Flux of an evaporated organic material in an X-shaped geometry with diffusivities of 1e−7 $m^2/s$ as shown in FIG. 3A, 1e−6 $m^2/s$ as shown in FIG. 3B, and 1e−5 $m^2/s$ as shown in FIG. 3C. The flow rate of the carrier gas (top left inlet) is $1\times10^{-8}$ $m^3/s$, while the flow rate of the blocking gas (bottom left inlet) is $1\times10^{-7}$ $m^3/s$. FIGS. 3A-3C show snapshots at 15 ms after turning on the blocking flow. The outlet to the micronozzle array is the opening on the bottom right. Following previous calculations, the diffusivity is expected to be about $1\times10^{-7}$ $m^2/s$ or lower for organic molecules, using a heavy (e.g., krypton or xenon) blocking gas. As the diffusivity increases, the fluidic shutter is less effective as the organic rapidly mixes between the streams.

FIGS. 4A-4C show organic flux in the cross-shaped geometry at different diffusivities. Flux of an evaporated organic material in a cross-shaped geometry with diffusivities of 1e−7 $m^2/s$ shown in FIG. 4A, 1e−6 $m^2/s$ as shown in FIG. 4B, and 1e−5 $m^2/s$ as shown in FIG. 4C. The flow rate of the carrier gas (top left inlet) is $1\times10^{-8}$ $m^3/s$, while the flow rate of the blocking gas (bottom left inlet) is $1\times10^{-7}$ $m^3/s$. FIGS. 4A-4C show snapshots are at 15 ms after turning on the blocking flow. The outlet to the micronozzle array is the opening on the bottom right.

Figure 5A:
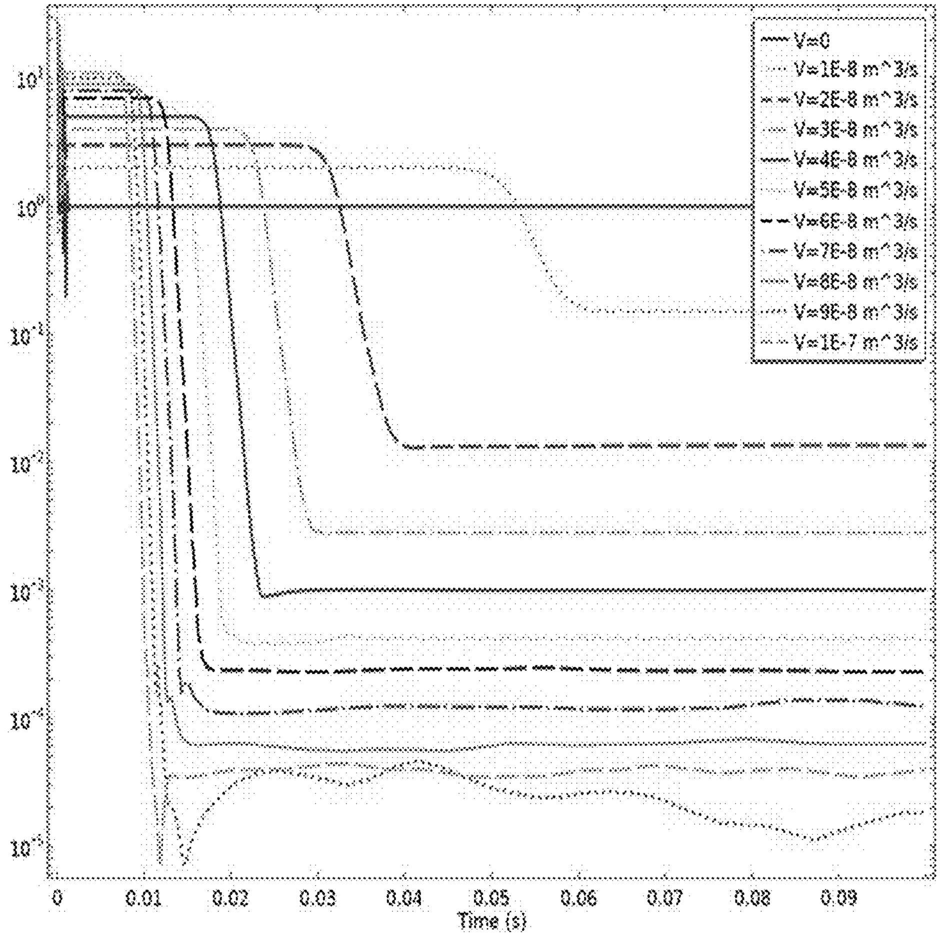
FIG. 5A shows paths of organic flux at an outlet for the X-shaped geometry at different flow rates for a blocking gas.
Figure 5B:
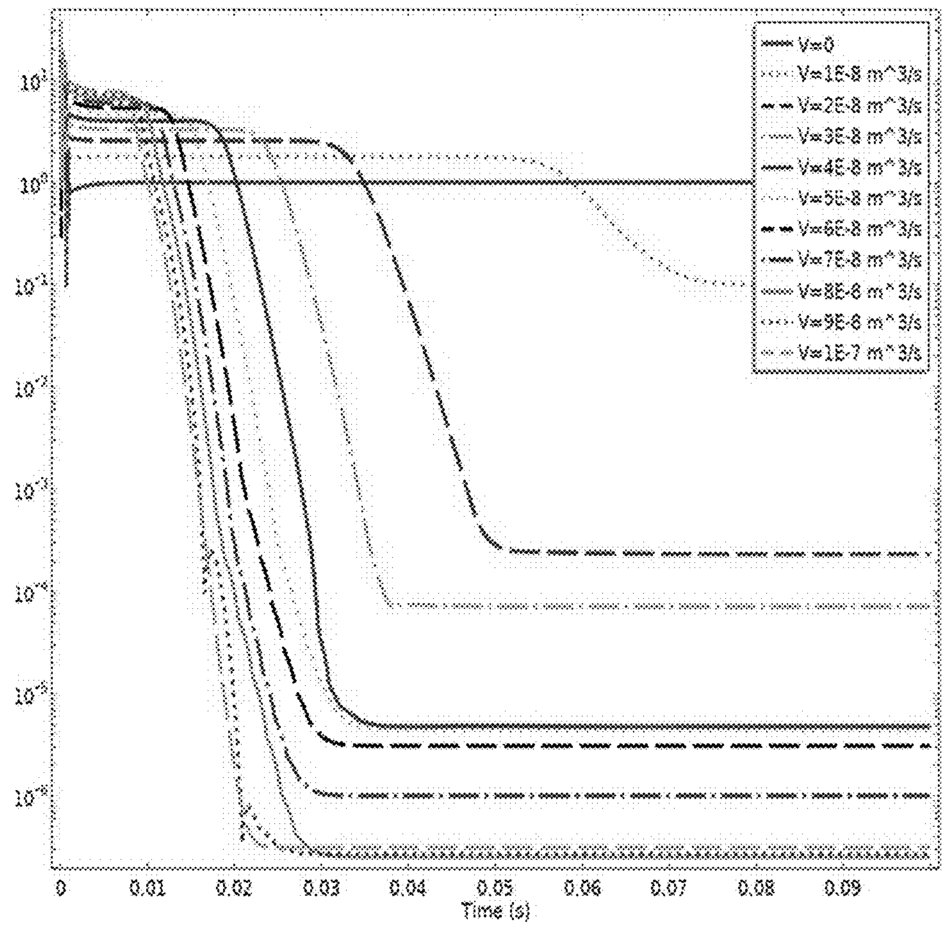
FIG. 5B shows paths of organic flux at an outlet for the cross-shaped geometry at different flow rates for a blocking gas according to embodiments of the disclosed subject matter.

FIG. 5A shows a comparison of the organic flux at the outlet for the X-shaped geometry at different flow rates for the blocking gas, and FIG. 5B shown a comparison of the organic flux at the outlet for of the cross-shaped geometry at different flow rates for the blocking gas. The carrier gas rate is fixed at $1\times10^{-8}$ $m^3/s$. Diffusivity is fixed at $1\times10^{-8}$ $m^2/s$. Values are normalized to the flux at V=0 $m^3/s$, or the flux with no blocking gas. At higher flow rates, the flux decreases more rapidly and to a lower absolute value. The X-shaped geometry shutters more rapidly but to a lower absolute value. A blocking flow of $1\times10^{-7}$ $m^3/s$ effectively shutters the flow within 20 ms in both geometries.

Figure 6A:
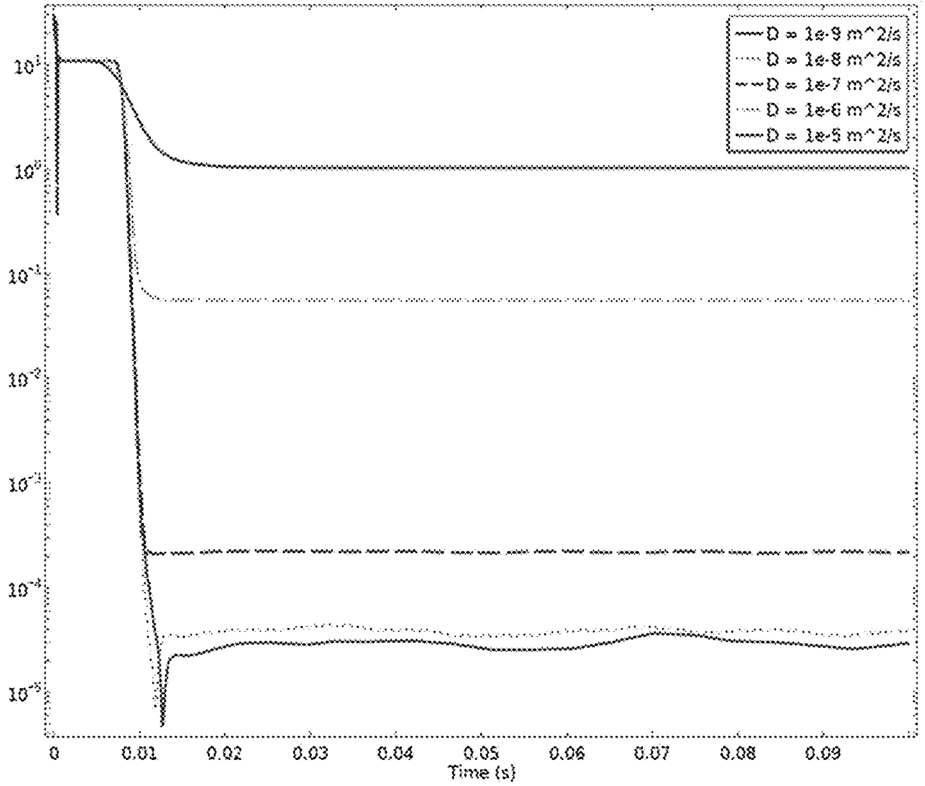
FIG. 6A shows a comparison of the organic flux at the outlet for the X-shaped geometry at different diffusivities for the organic material.
Figure 6B:
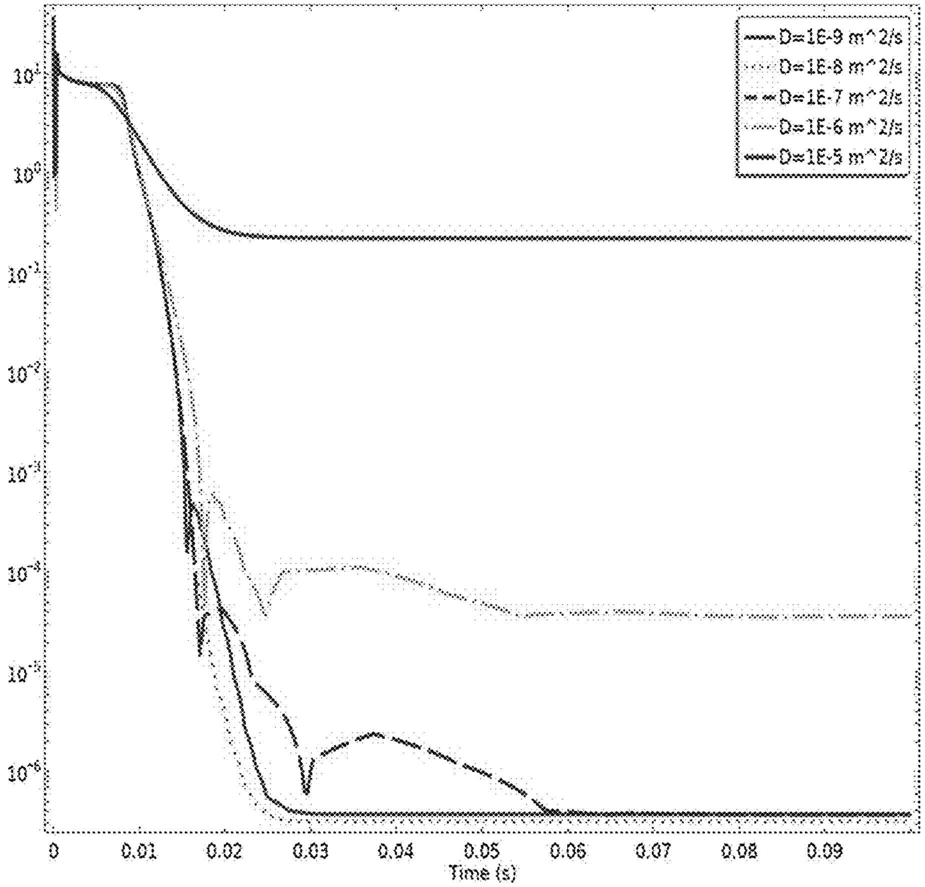
FIG. 6B shows a comparison of the organic flux at the outlet for the cross-shaped geometry at different diffusivities for the organic material according to embodiments of the disclosed subject matter.

FIG. 6A shows a comparison of the organic flux at the outlet for the X-shaped geometry at different diffusivities for the organic material, and FIG. 6B shows a comparison of the organic flux at the outlet for the cross-shaped geometry at different diffusivities for the organic material. In both geometries, the blocking flow is effective for diffusivities at or below $1\times10^{-7}$ $m^2/s$. The carrier gas rate is fixed at $1\times10^{-8}$ $m^3/s$ and the blocking gas rate is fixed at $1\times10^{-7}$ $m^3/s$. Values are normalized to the flux at V=0 $m^3/s$, or the flux with no blocking gas.

All simulations (e.g., for FIGS. 3A-6B) were performed using COMSOL Multiphysics™, with the "Transport of Diluted Species" and "Laminar Flow" modules. Slip flow was applied as a boundary condition.

According to an embodiment, an organic vapor jet printing (OVJP) system (e.g., as shown in FIGS. 8A-8B) may include an organic material source (e.g., organic source boat shown in FIGS. 8A-8B), a carrier gas source (e.g., carrier gas shown in FIGS. 8A-8B, a blocking gas supply (e.g., blocking gas shown in FIGS. 8A-8B), and a printhead (e.g., printhead shown in FIGS. 8A-8B) in fluidic communication with the organic material source and the carrier gas source. The printhead may include a fluidic shutter comprising a plurality of microchannels (e.g., as shown in FIGS. 7A-7C), and a micronozzle array connected to the fluidic shutter. In an embodiment, the plurality of microchannels may be in fluidic communication with one another and may be configured to mix carrier gas received from the carrier gas source and organic materials received from the organic material source to form a carrier-organic mixture to be received by the micronozzle array. In an alternative embodiment, the plurality of microchannels may be in fluidic communication with one another and one microchannel of the plurality of microchannels may be configured to receive a carrier-organic mixture (i.e., a mixture of carrier gas source and organic materials) that is mixed upstream from the one microchannel of the plurality of microchannels and the carrier-organic mixture is to be received by the micronozzle array. The plurality of microchannels may include a first microchannel to receive the carrier-organic mixture, a second microchannel to receive a blocking gas from the blocking gas supply, a third microchannel fluidically connected to the micronozzle array, and a fourth microchannel fluidically connected to an exhaust line (e.g., exhaust shown in FIGS. 8A-8B). The carrier-organic mixture may be provided to the micronozzle array for deposition on a substrate when the apparatus is configured to operate in a first operating mode (e.g., as shown in FIG. 8A). The blocking gas may direct evaporated organic material of the carrier-organic mix to the exhaust line when the apparatus is configured to operate in a second operating mode (e.g., as shown in FIG. 8B).

The plurality of microchannels (see, e.g., FIGS. 7A-7C) may be arranged in a predetermined geometry, where an angle between the first microchannel, the second microchannel, the third microchannel, and the fourth microchannel varies based on the predetermined geometry. The predetermined geometry may be an x-shaped geometry (see, e.g., FIGS. 3A-3C), and/or a cross-shaped geometry (see, e.g., FIGS. 4A-4C).

The fluidic shutter may be controlled by a speed of the carrier organic and the blocking gas, diffusivity of the carrier-organic, and/or a size of the plurality of microchannels. A size of at least one of the plurality of microchannels of the apparatus may be decreased to increase a speed of the fluidic shutter. One or more gas inlets of the apparatus coupled to the micronozzle array may be tapered to increase the velocity of the carrier-organic mix.

The blocking gas may include xenon gas, krypton gas, nitrogen gas, and/or argon gas. The blocking gas may decrease a diffusivity of the carrier-organic mixture into a blocking stream. The apparatus may include a solenoid valve (see, e.g., the valve shown in FIGS. 8A-8B) to keep the blocking gas at a predetermined high pressure. When the solenoid valve is opened, the blocking gas may flow through at least one of the plurality of microchannels.

According to an embodiment, a printhead (see, e.g., FIGS. 8A-8B) may include a fluidic shutter comprising a plurality of microchannels (see, e.g., FIGS. 7A-7C), and a micronozzle array (e.g., nozzles shown in FIGS. 8A-8B) connected to the fluidic shutter (e.g., valve shown in FIGS. 8A-8B). In an embodiment, the plurality of microchannels may be in fluidic communication with one another and are configured to mix carrier gas received from a carrier gas source (e.g., carrier gas shown in FIGS. 8A-8C) and organic materials received from an organic material source (e.g., organic source boat shown in FIGS. 8A-8B) to form a carrier-organic mixture to be received by the micronozzle array. In an alternative embodiment, the plurality of microchannels may be in fluidic communication with one another and one microchannel of the plurality of microchannels may be configured to receive a carrier-organic mixture (i.e., a mixture of carrier gas source and organic materials) that is mixed upstream from the one microchannel of the plurality of microchannels and the carrier-organic mixture is to be received by the micronozzle array. The plurality of microchannels may include a first microchannel to receive the carrier-organic mixture, a second microchannel to receive a blocking gas from a blocking gas supply, a third microchannel fluidically connected to the micronozzle array, and a fourth microchannel fluidically connected to an exhaust line (see, e.g., FIGS. 7A-7C). The carrier-organic mixture may be provided to the micronozzle array for deposition on a substrate (e.g., substrate shown in FIGS. 8A-8B) when the print head is configured to operate in a first operating mode (e.g., as shown in FIG. 8A). The blocking gas may direct evaporated organic material of the carrier-organic mix to the exhaust line when the print head is configured to operate in a second operating mode (e.g., as shown in FIG. 8B).

According to an embodiment, a fluidic shutter may include a plurality of microchannels (see, e.g., FIGS. 7A-7C). In an embodiment, the plurality of microchannels may be in fluidic communication with one another and may be configured to mix carrier gas received from a carrier gas source (e.g., carrier gas shown in FIG. 8A) and organic materials received from an organic material source (e.g., organic source boat shown in FIG. 8B) to form a carrier-organic mixture to be received by a micronozzle array (e.g., nozzles shown in FIG. 8A-8B) connected to the fluidic shutter (e.g., valve shown in FIGS. 8A-8B). In an alternative embodiment, the plurality of microchannels may be in fluidic communication with one another and one microchannel of the plurality of microchannels may be configured to receive a carrier-organic mixture (i.e., a mixture of carrier gas source and organic materials) that is mixed upstream from the one microchannel of the plurality of microchannels and the carrier-organic mixture is to be received by the micronozzle array. The plurality of microchannels may include a first microchannel to receive the carrier-organic mixture, a second microchannel to receive a blocking gas from a blocking gas supply (e.g., blocking gas shown in FIGS. 8A-8B), a third microchannel fluidically connected to the micronozzle array, and a fourth microchannel fluidically connected to an exhaust line (e.g., exhaust shown in FIGS. 8A-8B). The carrier-organic mixture may be provided to the micronozzle array for deposition on a substrate when the fluidic shutter is configured to operate in a first operating mode (e.g., as shown in FIG. 8A). The blocking gas may direct evaporated organic material of the carrier-organic mix to the exhaust line when the fluidic shutter is configured to operate in a second operating mode (e.g., as shown in FIG. 8B).

In an embodiment, a method of controlling gas flow for deposition is disclosed. A first carrier-organic mixture is provided to a first microchannel. A blocking gas is provided to a second microchannel and the second microchannel is in fluid communication with the first microchannel. A decrease or no blocking gas supply is provided, when the gas flow for deposition is to be turned on, and the first carrier-organic mixture flows into a third microchannel connected to a micronozzle array for deposition and in fluid communication with the first microchannel and second microchannel. An increase in blocking gas supply is provided, when the gas flow for deposition is to be turned off, and the blocking gas supply and first carrier-organic mixture flows into a fourth microchannel connected to an exhaust line and in fluid communication with the first microchannel and second microchannel.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. An organic vapor jet printing (OVJP) system comprising:

an organic material source;

a carrier gas source;

a blocking gas supply; and a printhead in fluidic communication with the organic material source and the carrier gas source, the printhead comprising:

a fluidic shutter comprising a plurality of microchannels, wherein the plurality of microchannels are in fluidic communication with one another; and a micronozzle array connected to the fluidic shutter, wherein the plurality of microchannels comprise:

a first microchannel to receive a carrier-organic mixture;

a second microchannel to receive a blocking gas from the blocking gas supply;

a third microchannel fluidically connected to the micronozzle array; and a fourth microchannel fluidically connected to an exhaust line, wherein the carrier-organic mixture is provided to the micronozzle array for deposition on a substrate when the apparatus is configured to operate in a first operating mode, and wherein the blocking gas directs evaporated organic material of the carrier-organic mix to the exhaust line when the apparatus is configured to operate in a second operating mode.

2. The apparatus of claim 1, wherein the plurality of microchannels are arranged in a predetermined geometry, wherein an angle between the first microchannel, the second microchannel, the third microchannel, and the fourth microchannel varies based on the predetermined geometry.

3. The apparatus of claim 2, wherein the predetermined geometry is at least one selected from the group consisting of: a x-shaped geometry, and a cross-shaped geometry.

4. The apparatus of claim 1, wherein the fluidic shutter is controlled by at least one selected from the group consisting of: speed of the carrier organic and the blocking gas, diffusivity of the carrier-organic, and a size of the plurality of microchannels.

5. The apparatus of claim 1, wherein the blocking gas comprises at least one selected from the group consisting of: xenon gas, krypton gas, nitrogen gas, and argon gas.

6. The apparatus of claim 1, wherein the blocking gas decreases a diffusivity of the carrier-organic mixture into a blocking stream.

7. The apparatus of claim 1, further comprising a solenoid valve to keep the blocking gas at a predetermined high pressure.

8. The apparatus of claim 7, wherein when the solenoid valve is opened, the blocking gas flows through at least one of the plurality of microchannels.

9. The apparatus of claim 1, wherein one or more gas inlets coupled to the micronozzle array are tapered to increase the velocity of the carrier-organic mix.

10. The apparatus of claim 1, wherein a size of at least one the plurality of microchannels is decreased to increase a speed of the fluidic shutter.

11. A printhead, comprising:

a fluidic shutter comprising a plurality of microchannels, wherein the plurality of microchannels are in fluidic communication with one another; and a micronozzle array connected to the fluidic shutter, wherein the plurality of microchannels comprise:

a first microchannel to receive a carrier-organic mixture;

a second microchannel to receive a blocking gas from a blocking gas supply;

a third microchannel fluidically connected to the micronozzle array; and a fourth microchannel fluidically connected to an exhaust line, wherein the carrier-organic mixture is provided to the micronozzle array for deposition on a substrate when the print head is configured to operate in a first operating mode, and wherein the blocking gas directs evaporated organic material of the carrier-organic mix to the exhaust line when the print head is configured to operate in a second operating mode.

12. A fluidic shutter, comprising:

a plurality of microchannels in fluidic communication with one another, and wherein the plurality of microchannels comprise:

a first microchannel to receive a carrier-organic mixture;

a second microchannel to receive a blocking gas from a blocking gas supply;

a third microchannel fluidically connected to the micronozzle array; and a fourth microchannel fluidically connected to an exhaust line, wherein the carrier-organic mixture is provided to the micronozzle array for deposition on a substrate when the fluidic shutter is configured to operate in a first operating mode, and wherein the blocking gas directs evaporated organic material of the carrier-organic mix to the exhaust line when the fluidic shutter is configured to operate in a second operating mode.

* * * * *